(12) United States Patent
Jeon et al.

(10) Patent No.: US 8,802,251 B2
(45) Date of Patent: Aug. 12, 2014

(54) THERMOELECTRIC CONVERSION DEVICE USING A SOLVATING MATERIAL

(71) Applicant: Dongguk University Industry-Academic Cooperation Foundation, Seoul (KR)

(72) Inventors: Joon Hyeon Jeon, Gyeonggi-do (KR); Han Woo Park, Seoul (KR); Ji Beom Kim, Incheon (KR); Jin Koo Rhee, Seoul (KR)

(73) Assignee: Dongguk University Industry-Academic Cooperation Foundation, Seoul (KR)

( * ) Notice: Subject to any disclaimer, the term of this patent is extended or adjusted under 35 U.S.C. 154(b) by 75 days.

(21) Appl. No.: 13/675,627

(22) Filed: Nov. 13, 2012

(65) Prior Publication Data
US 2013/0068272 A1    Mar. 21, 2013

Related U.S. Application Data

(63) Continuation of application No. PCT/KR2011/002804, filed on Apr. 20, 2011.

(30) Foreign Application Priority Data

May 10, 2010    (KR) ........................ 10-2010-0043298

(51) Int. Cl.
*H01L 37/00* (2006.01)
*H01G 9/21* (2006.01)

(52) U.S. Cl.
CPC ...................................... *H01G 9/21* (2013.01)
USPC ............................................. 429/11; 136/205

(58) Field of Classification Search
CPC ......................................................... H01G 9/21
USPC ............................................. 429/11; 136/205
See application file for complete search history.

(56) References Cited

FOREIGN PATENT DOCUMENTS

| | | |
|---|---|---|
| JP | 02101976 A | 4/1990 |
| JP | H0667235 B2 | 8/1994 |
| JP | 08138730 A | 5/1996 |
| JP | 2004147397 A | 5/2004 |
| WO | WO2010/023669 A2 * | 3/2010 ............. H02N 11/00 |

OTHER PUBLICATIONS

PCT International Preliminary Report on Patentability—English Translation of Written Opinion dated Nov. 13, 2012, received in corresponding PCT Application No. PCT/KR11/02804, 5 pgs.
PCT International Search Report dated Nov. 22, 2011, received in corresponding PCT Application No. PCT/KR11/02804, 2 pgs.

* cited by examiner

*Primary Examiner* — Maria J Laios
(74) *Attorney, Agent, or Firm* — Grossman Tucker Perreault & Pfleger, PLLC

(57) ABSTRACT

The present invention relates to a thermoelectric conversion device using a solvating material, the device comprising: a cell with a closed structure, comprising a metal ammonia or metal amine compound as a solvating material; a polarization or porous separation membrane; and a heating unit, which prevents the outflow of the solvating material and thus maintains the solvating material in a reversible state.

14 Claims, 4 Drawing Sheets

THERMOELECTRIC CONVERSION DEVICE USING A SOLVATING MATERIAL

CROSS-REFERENCE TO RELATED APPLICATIONS

This application is a continuation of PCT/KR2011/002804 filed Apr. 20, 2011, which claims the benefit of Korean Patent Application No. 10-2010-0043298, filed with the Korean Intellectual Property Office on May 10, 2010, the disclosure of which is incorporated herein by reference in its entirety.

TECHNICAL FIELD

The present invention relates to a thermoelectric conversion device using a solvating material, and more particularly, to a thermoelectric conversion device using a solvating material which prevents the outflow of the solvating material and thus maintains the solvating material in a reversible state.

BACKGROUND ART

A great deal of development research is currently under way on renewable energy and clean energy with increasing concern about depletion of fossil fuels and environmental pollution. It has been widely studied in the field of thermoelectric conversion which allows direct generation of electricity from a solid state, eliminates noises and shakes, and generates thus electrical energy only with temperature difference.

A thermoelectric conversion was first developed by Seebeck, a German physicist, in 1821 by discovering the creation of electromotive force when each of two different metals joined in two places was exposed to a different temperature. Conventional thermoelectric devices developed in US and Japan use p-n junction and most of developments were focused on thin films of high efficient thermoelectric materials. Most of thermoelectric materials having properties of a metal compound show thermoelectric conversion by a temperature difference between two electrodes ($\Delta T$ between + pole and − pole). Thermoelectric efficiency depends on the figures of merit ZT as shown below.

$$ZT = \frac{\alpha^2 \sigma T}{k} \begin{cases} \alpha \text{ Seebeck coefficient} \\ \sigma \text{ electrical conductivity} \\ \kappa \text{ thermal conductivity} \\ T \text{ average absolute temperature} \end{cases}$$

However, such a thermoelectric material reacting by a temperature difference between two electrodes has very low thermoelectric efficiency compared to its weight and size and thus, it is not possible to use as an energy source. Further, a thermoelectric material reacting at a high temperature difference ($\Delta T=150$-$700°$ C.) has disadvantage of requiring a large waste heat recovery system such as incinerator.

A metal ammonia and metal amine material used as a solvating material has been confirmed only for its possibility that can be utilized as a new energy source. It is still in the experimental state for its electrical phenomenon. Since only articles have been reported so far that a solvating material shows thermoelectric effect at 65° C. below zero to 35° C. below zero, it is still in a basic development stage.

A solvating material which is a compound including solvated electrons has both metallic properties and non-metallic properties depending on a metal concentration. $M(NH_3)_n$ as a solvating material, which is prepared by reacting with an alkali metal or alkali earth metal, lanthanum metal or actinium metal, etc. at 34° C. or less below zero where it exists in a liquid state, is separated into $M(NH_3)_{n-x}$ and $xNH_3$. Alkali metals, alkali earth metals, lanthanum metals and actinium metals, which correspond to M, have high reactivity to be easily oxidized when they are exposed to water or oxygen, while $NH_3$ lowers reactivity since its gas is light and scattered into the air easily. $M(NH_3)_4$, in which n is 4, is relatively stable. Equation to synthesize a solvating material is as follows.

A solvating material existing in a liquid state is bronze color with higher saturated concentration in ammonia, which is one of usable solvents, and also has physical properties similar to a metal having metal ions and free electrons, and high electrical conductivity. When a concentration of metal ammonia is 0.01 MPM or less, it has electrolyte characteristics including solvated electrons and solvated cations, when it is 2-5 MPM, its characteristics change from non-metal to metal, when it is 4 MPM, free electrons are generated, when it is about 20 MPM, it has electrical conductivity similar to mercury, and when it is 22 MPM, it has 15000 $\Omega^{-1}$ cm$^{-1}$ of electrical conductivity which is higher than that of mercury (10000 $\Omega^{-1}$ cm$^{-1}$).

Color of the solvating material is determined at various concentrations. When the concentration is 22 MPM at which it shows metallic characteristics, it becomes bronze. The color gradually becomes lighter with lowered concentration changing from red to blue which is shown at a concentration of 2 MPM. The reason to show a blue color at a low MPM is that the ammonia surrounds electrons (called as solvated electrons). One electron is released from a metal by an ionization reaction in a metal solution as suggested by Kraus, $M_{metal} \rightarrow M_s^+ + e_s^-$, and surrounded by $NH_3$. In case of lithium, when lithium is dissolved in an ammonia solution, an electron is released from lithium which is then turned to lithium ion ($Li^+$) as shown below.

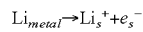

Alkali metals, alkali earth metals, lanthanum metals and actinium metals, which have generally high electron density, release an electron while dissolved in an ammonia solution and is surrounded by ammonia, which forms then solvated electrons. An electrochemical oxidation reaction of a solvating material solution when M is lithium is as follows.

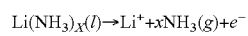

The solvating material solution is decomposed to a free electron and ammonia gas. The generated electron and ammonia are combined to form solvated electrons at a low concentration and the electron is released to a free electron at a high concentration.

$e_s^-(iNH_3)$, which is in a solvated electron state, generates a free electron, $e_f^-$, with increasing concentration of the solvated metal, while when $NH_3$ is added or a concentration of the material is lowered, the solvated electron, $e_s^-(iNH_3)$, is generated as shown below.

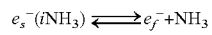

A solvated electron founded at a concentration of 8 MPM or less is a combined form of the electron released from a metal and ammonia molecule. The combined forms between electrons and ammonia molecules increase and it becomes an insulator when the concentration gets lowered, while electrons are released from the solvated electrons when the concentration gets higher. It is noted that when the concentration is 4 MPM or higher, free electrons are found.

As described above, solvated electrons, which are combined forms of electrons generated from the metal and ammonia, are generated according to synthetic concentration of a solvating material. Even though thermoelectric performance is noted from the oxidation reaction with temperature changes and electron releasing and combining phenomenon of solvated electrons with metal concentration changes, alkali metals and alkali earth metals, lanthanum metals and actinium metals have high reactivity to be oxidized easily when they are exposed to water or oxygen and $NH_3$ lowers reactivity since its gas is light and scattered into the air easily. Therefore, there is demand on developing a thermoelectric conversion device which can maintain a solvating material in a reversible condition in the mechanism of separating into free electrons and solvent gas from a material including solvated electrons by heat, increasing internal pressure by the gas generated from the separated material, and generating electrical energy by releasing electrons.

SUMMARY

The present invention has been completed with providing a thermoelectric conversion device using a solvating material to resolve the problem associated with the above-mentioned prior art.

An object of the invention is to provide a thermoelectric conversion device using a solvating material, the device comprising: a cell with a closed structure, comprising a metal ammonia or metal amine compound as a solvating material; a polarization or porous separation membrane located at the center of the cell to separate the cell into two sides; and a heating unit located at one side of the cell, which prevents the outflow of the solvating material and thus maintains the solvating material in a reversible state.

To achieve the foregoing objective, the present invention provides a thermoelectric conversion device using a solvating material, the device comprising: a cell with a closed structure, comprising a metal ammonia or metal amine compound as a solvating material; a polarization or porous separation membrane located at the center of the cell to separate the cell into two sides; and a heating unit located at one side of the cell.

According to an embodiment of the invention, the thermoelectric conversion device may further comprise cathode and anode comprised of a metallic material each passing through the inside and outside the cell at the each end of the cell According to an embodiment of the invention, the metallic material of the cathode may be one chosen from Al, Fe, Pt, Ag, Au, and an alloy comprising at least one thereof.

According to an embodiment of the invention, the cathode may be one side being heated by the heating unit and the anode may be the other side.

According to an embodiment of the invention, the cell may have a structure selected from the group consisting of a cylindrical type, a plate type, a tubular type, a circular type and a film type.

According to an embodiment of the invention, the both sides of the cell may be comprised of a conductive material.

According to an embodiment of the invention, the material of one side of the cell may have a lower thermal conductivity than that of the other side.

According to an embodiment of the invention, the cell may be embedded with a metallic structure therein to widen a contact area with the solvating material.

According to an embodiment of the invention, the polarization or porous separation membrane may be comprised of an insulating material, the polarization may have space which is a passageway penetrating the both ends of the cell, and the porous separation membrane may be jointed with two individual cells having a closed structure therewith as the center.

According to an embodiment of the invention, the metal ammonia or metal amine compound may be composed with at least one selected from the group consisting of an ammonia and amine compound and at least one metallic element selected from the group consisting of an alkali metal and an alkali earth metal.

According to an embodiment of the invention, the amine compound may be at least one selected from the group consisting of metylamine, ethylamine, diglyme, ethanolamine, diethanolamine, n-propylamine, isoproplyamine, butylamine, triethylamine, hexamine, ethylenediamine, 1,3-propanediamine, 1,2-1 propanediamine, 1,4-butanediamine, 1,5-diaminopentane, hexanediamine, 1,7-diaminoheptane, 1,8-diaminooctane, and diethylenetriamine.

According to an embodiment of the invention, the metallic element may be at least one selected from the group consisting of Li, Na, K, Rb, Cs, Mg, Ca, Sr, Ba, Ra, Cu, Al, Ga, In, Tl, Mn, Bi, V, Ti, Y(III), Zn, Fe, Cr, Ag, Pt, Hg, Pb, Be, La, Ce, Cd, and Eu.

According to an embodiment of the invention, a heating source of the heating unit may be waste heat.

According to another embodiment of the invention, there is provided a method for converting thermal energy to electrical energy by using the thermoelectric conversion device of the present invention.

According to still another embodiment of the invention, there is provided a method for charging a secondary battery by connecting the both ends or the cathode and anode of the cell of the thermoelectric conversion device with the both electrodes of the secondary battery.

Advantageous Effects

A thermoelectric conversion device using a solvating material according to the present invention converts thermal energy to electrical energy by using waste heat, so that it reduces the waste of resources compared to electrical generation using fossils, coals, etc. In addition, it can generate electrical energy by creating a temperature difference on each side of the electrodes even with less heat, allow diversifying sizes of devices, and especially generate electrical energy continuously since it can maintain the solvating material in a reversible state. Further, the thermoelectric conversion device of the present invention can be applied widely from small devices requiring a small scale of power to large ones requiring a large scale of power because cells are connected in series as a bundle type to create power.

DETAILED DESCRIPTION OF THE INVENTION

While the present invention has been described with reference to particular embodiments, it is to be appreciated that various changes and modifications may be made by those skilled in the art without departing from the spirit and scope of the present invention, as defined by the appended claims and their equivalents. Throughout the description of the present invention, when describing a certain technology is determined to evade the point of the present invention, the pertinent detailed description will be omitted.

Figure 8:
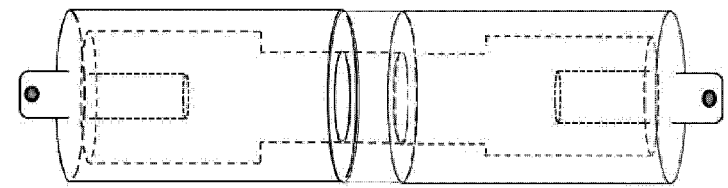
FIG. 8 is a perspective view of a thermoelectric conversion device polarized by using a solvating material.
Figure 9:
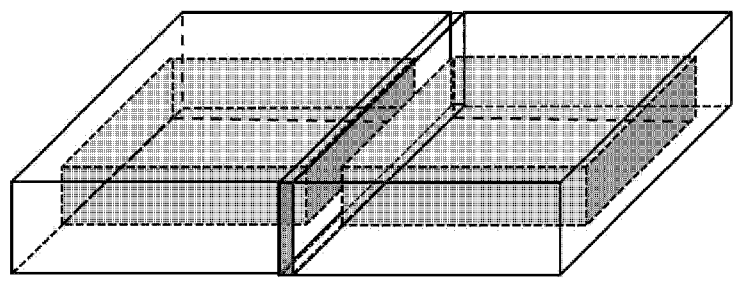
FIG. 9 is a perspective view of 2 independent (plate- or film-typed) cells of thermoelectric conversion devices using a solvating material in FIG. 2, jointed at the both sides from the center of a porous separation membrane, so that cathode and anode are engaged with the cell body.
Figure 10:
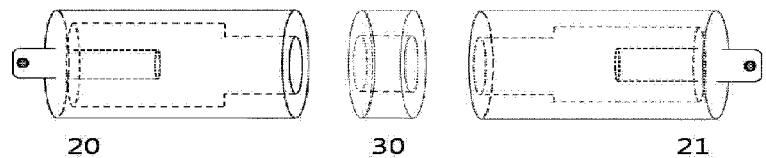
FIG. 10 is an exploded view of the thermoelectric conversion device polarized by using a solvating material in FIG. 8.
Figure 11:
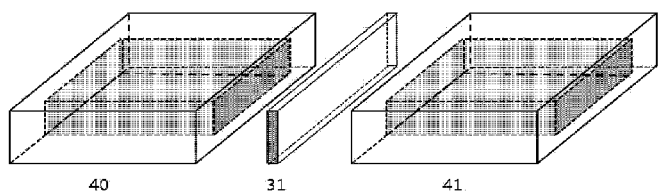
FIG. 11 is an exploded view of the thermoelectric conversion device using a solvating material having a porous separation membrane of FIG. 9.

The present invention provides a thermoelectric conversion device using a solvating material, comprising: a cell with a closed structure, comprising a metal ammonia or metal amine compound as a solvating material; a polarization or porous separation membrane; and a heating unit, which prevents the outflow of the solvating material and thus maintains the solvating material in a reversible state. More particularly, it provides a thermoelectric conversion device using a solvating material, comprising: a cell with a closed structure, comprising a metal ammonia or metal amine compound as a solvating material; a polarization or porous separation membrane located at the center of the cell to separate the cell into two sides; and a heating unit located at one side of the cell. FIG. 8 is a perspective view of a thermoelectric conversion device polarized by using a solvating material and FIG. 10 is an exploded view thereof. FIG. 9 is a perspective view of a thermoelectric conversion device using a solvating material having a porous separation membrane and FIG. 11 is an exploded view thereof. As shown in FIG. 10 and FIG. 11, each of the cathode and the anode of the thermoelectric conversion device separated by the porous separation membrane itself is used as an independent thermoelectric conversion device and is engaged with the metal structure integrally.

Figure 2:
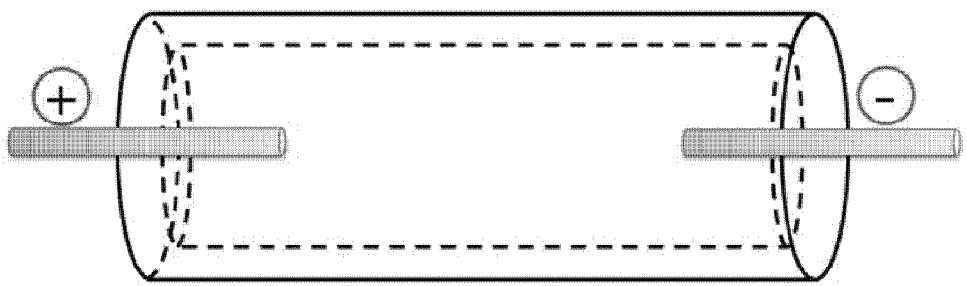
FIG. 2 shows a simplified cell of a thermoelectric conversion device using a solvating material according to the present invention.
Figure 3:
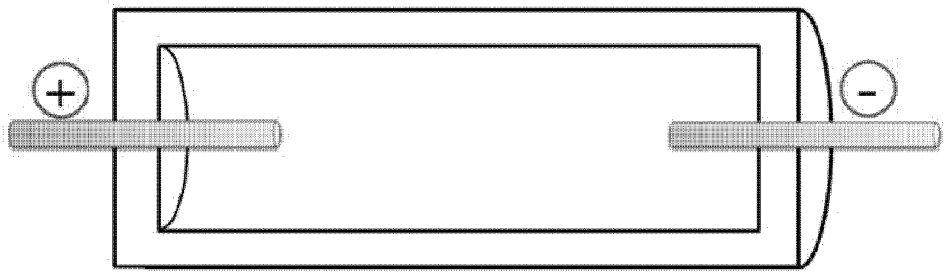
FIG. 3 is a sectional view of a cell of a thermoelectric conversion device using a solvating material according to the present invention.

As described below, the cell structure of the thermoelectric conversion device using a solvating material of the present invention allows continuous generation of electrical energy by maintaining the solvating material in a reversible state, and preventing the solvating material from contact with outside by having a closed cell structure. The cell may have a structure chosen from a cylindrical type, a plate type, a tubular type, a circular type and a film type, but it is not limited thereto. The cell has a completely closed structure to prevent the solvating material embedded therein contact with outside by isolating the internal space from outside. FIG. 2 shows a simplified cell of a thermoelectric conversion device using a solvating material according to the present invention and FIG. 3 is a sectional view of a cell of a thermoelectric conversion device using a solvating material according to the present invention. Further, FIG. 7, FIG. 8, FIG. 9 and FIG. 11 are plate- or film-typed cells of a thermoelectric conversion device using a solvating material according to the present invention.

In addition, it may be apparent that materials of the cell have significantly a low reactivity with a metal ammonia or metal amine compound due to corrosiveness with the metal ammonia or metal amine compound. Particularly, a thickness should be considered according to strength of a material of the cell since when metal ammonia is used, ammonia existing in a gas state according to temperature is expanded and increase the pressure of inside the cell. Thermal conductivity and electrical conductivity of a cell material should be also considered since heat is converted to electricity to create electrical energy. Regarding the thermal conductivity, the material not only fulfills heat transfer effectively with temperature changes but also does not reach thermal equilibrium easily, while it has excellent electrical conductivity in order to minimize loss of the electrical energy generated by the thermoelectric material. Accordingly, it is apparent that the both sides of the cell be comprised of a conductive material.

One side of the cell, which is located where the heating unit is, is the place to absorb heat rapidly and generate electrons by chemical reactions of a material with the absorbed heat, and the thermal conductivity and electrical conductivity thereof is high to prevent the loss of power caused by resistance. The other side of the cell is composed of a material having a high electrical conductivity and a low thermal conductivity in order to maintain a temperature difference and thus, prevent from reaching the thermal equilibrium. Therefore, it is apparent that the material of one side of the cell have a lower thermal conductivity than that of the other side.

Figure 4:
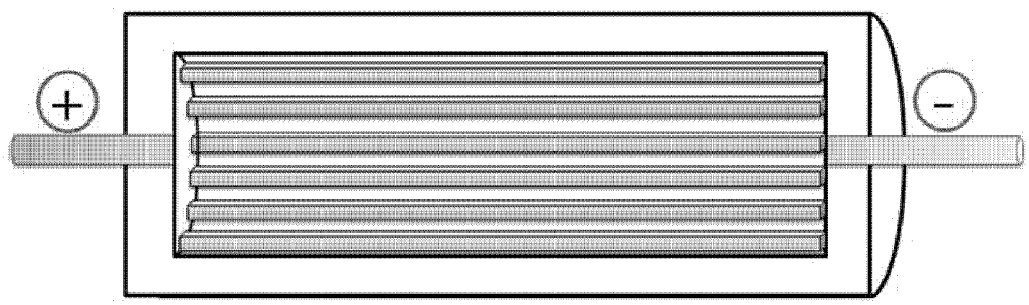
FIGS. 4, 5, and 6 show a thermoelectric conversion device using a solvating material according to the present invention, in which various metallic structures are embedded in order to increase the area inside the cell thereof.
Figure 5:
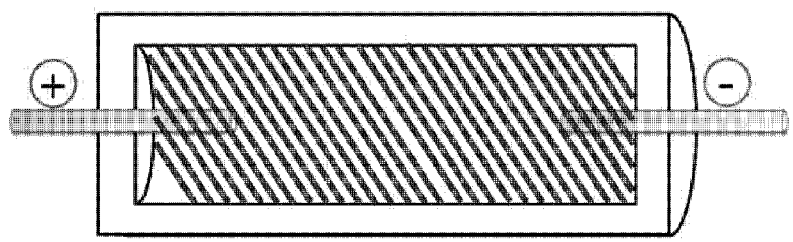
Figure 6:
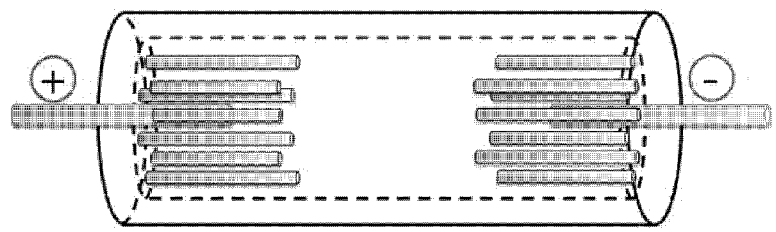
Figure 7:
FIG. 7 is a plate- or film-typed cell of a thermoelectric conversion device using a solvating material according to the present invention.

According to the present invention, a metallic structure may be embedded inside the cell to widen a contact area with the solvating material. Since the insertion of the metallic structure inside the cell increases a reaction area to generate more electrons, various types of metallic structures may be embedded inside the cell. FIGS. 4, 5, and 6 show a thermoelectric conversion device using a solvating material according to the present invention, in which various metallic structures are embedded in order to increase the area inside the cell thereof.

A polarization or porous separation membrane is located at the center of the cell separating into two sides and is comprised of an insulating material which thus, allows the electrons separated from the solvating material not flow along with the cell body, but toward each metal electrode.

Figure 12:
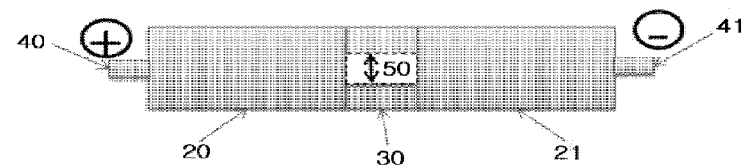
FIG. 12 shows a thermoelectric conversion device having space, which is a passageway, penetrating the both ends of the cell when a polarization is at the center of a thermoelectric conversion device using a solvating material of the present invention, and of which the cell body is engaged with cathode and anode.
Figure 13:
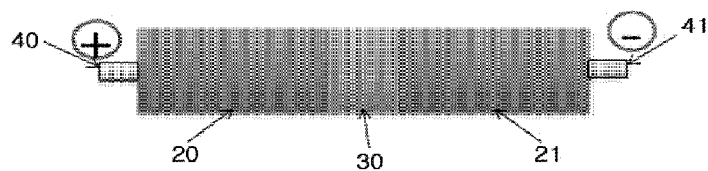
FIG. 13 shows a thermoelectric conversion device using a solvating material of the present invention of which the cell body is separable from cathode and anode.

It is apparent that the polarization separating the cell into two sides have passageway space penetrating the both ends of the cell. Since the electrons move by movement of gas during the electrical energy generation reaction, a passageway is needed to allow the movement of the generated electrons. A movement speed of the material between two sides can be controlled by controlling width of the space of the polarization. FIG. 12 shows a thermoelectric conversion device having passageway space penetrating the both ends of the cell.

The porous separation membrane separates the cell into two sides and electrons move through air holes thereof. FIG. 9 and FIG. 11 are a perspective view and an exploded view of the thermoelectric conversion device polarized by using a solvating material, respectively.

The thermoelectric conversion device using a solvating material having a porous separation membrane in FIG. 9 and FIG. 11 has a structure having two independent thermoelectric conversion device cells of FIG. 2 which are jointed at the center of the porous separation membrane. Each of the independent thermoelectric conversion device cells is a plate- or film-typed cell and cathode and anode are engaged with the cell body. Such a thermoelectric conversion device is manufactured in a plate or film type and used for micro parts or precision parts such as semiconductors. Further, it can provide high conversion efficiency since it is similar to pn semiconductor using the porous separation membrane.

The metal ammonia or metal amine compound may be composed of at least one chosen from an ammonia and amine compound and at least one metallic element chosen from an alkali metal and an alkali earth metal.

The amine compound is at least one chosen from methylamine, ethylamine, diglyme, ethanolamine, diethanolamine, n-propylamine, isoproplyamine, butylamine, triethylamine, hexamine, ethylenediamine, 1,3-propanediamine, 1,2-1 propanediamine, 1,4-butanediamine, 1,5-diaminopentane, hexanediamine, 1,7-diaminoheptane, 1, 8-diaminooctane, and diethylenetriamine, but it is not limited thereto.

The metallic element may be any metallic element such as at least one chosen from Li, Na, K, Rb, Cs, Mg, Ca, Sr, Ba, Ra, Cu, Al, Ga, In, Tl, Mn, Bi, V, Ti, Y(III), Zn, Fe, Cr, Ag, Pt, Hg, Pb, Be, La, Ce, Cd, and Eu, but it is not limited thereto.

A heating source of the heating unit is not limited if it generates heat, but preferable to be waste heat to reduce the waste of resources compared to electrical generation using fossils, coals, etc. since the thermoelectric conversion device of the present invention is able to generate electrical energy even though waste heat is used. Further, since it can generate electrical energy by creating a temperature difference on each side of the electrodes even with less heat, it allows electrical energy by using a small amount of heat.

According to the present invention, the thermoelectric conversion device further comprises cathode and anode comprised of a metallic material each passing through the inside and outside the cell at the each end of the cell. As described above, the both sides of the cell, which are separated by the polarization or porous separation membrane, themselves function as cathode and anode. Further, the cathode and the anode comprised of a metallic material, each passing through the inside and outside the cell, can be located at the both ends of the cell. Thus, when it is in contact with the solvating material inside the cell, electrons flow along the cell body and thus reduces degree of the resistance.

The metallic material of the cathode and the anode is one chosen from Al, Fe, Pt, Ag, Au, and an alloy comprising at least one thereof but it is not limited thereto. It is apparent that a metal having excellent electrical conductivity and thermal conductivity be used.

One side which is heated by the heating unit is called as a cathode and the other side is called as an anode. The electrode, which is heated, absorbs heat. Electrons are then generated from a solvating material and move to the other electrode, further move to outside the cell and move back to the electrode which is heated, so that the side where the heating unit is located and which is heated is a cathode and the other side which is not heated is an anode.

Hereinafter, a method for converting from thermal energy to electrical energy by using the thermoelectric conversion device using a solvating material of the present invention and its mechanism will be described.

When one side or a cathode is heated by a heating unit of the thermoelectric conversion device, as described above, heat is transferred to a metal ammonia or metal amine compound of a cell and a solvent of the compound is released as gas. The solvating material of which solvent is released is changed to a high concentration and then solvated electrons existed in a low concentration are decomposed and released to the other side or an anode of the cell to generate electric energy.

Figure 1:
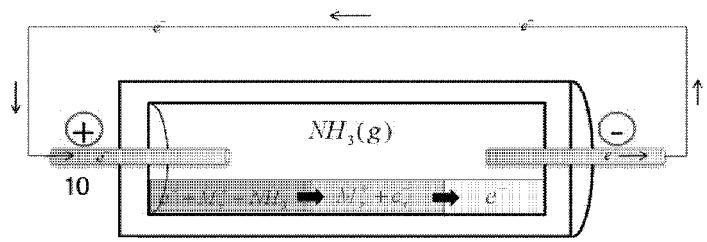
FIG. 1 shows operation of a thermoelectric conversion device using a solvating material according to the present invention.
Figure 15:
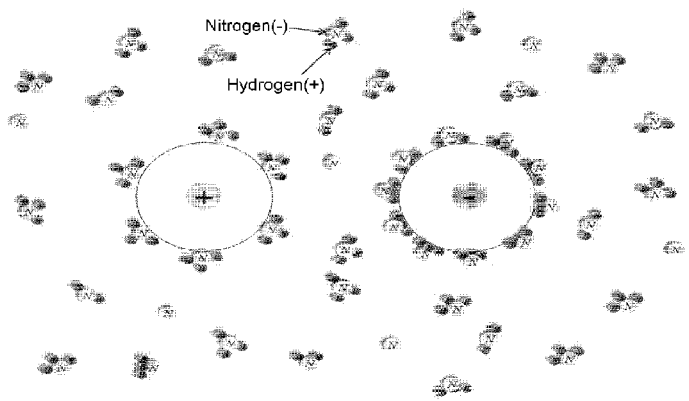
FIG. 15 shows a combined form of solvated metals and solvated electrons which is a solvating material.

There is provided a mechanism for converting from thermal energy to electrical energy, which are: solvated electrons generated by a solvating material are separated by heat, a concentration of metal becomes high due to the generation of solvent gas, free electrons which are useful to generate electrical energy are released and then are combined back to the solvated electrons according to temperature and pressure. FIG. 1 shows operation of a thermoelectric conversion device using a solvating material according to the present invention and FIG. 15 shows a combined form of solvated metals and solvated electrons which is a solvating material.

More particularly, when volume (V) is constant, pressure (P) is determined according to mole (n) of a material and temperature change (T). When a solvating material, which exists in a liquid state at a temperature of a boiling point or less of a solvent gas, is embedded in a cell where a volume is constant, the solvent gas can be separated from the solvating material when a temperature becomes a boiling point or higher with heating and fills empty space of the cell. The amount of the solvent gas increases with increasing temperature and thus greater pressure will be applied as a proportional relationship of $P \propto T$ since the volume inside the cell is constant. Further, the pressure may affect to the solvating material existing in a liquid state, so that a certain level or higher of pressure cannot be applied due to the gas generated with increasing temperature. Accordingly, when compensation pressure is applied with increasing temperature at a constant volume, gas separation does not occur anymore and the material exists in a liquid state while keeping a constant concentration. The thermoelectric conversion device of the present invention allows continuous generation of electric energy by maintaining the solvating material in a reversible state for the reaction to generate electric energy through such a mechanism.

Figure 14:
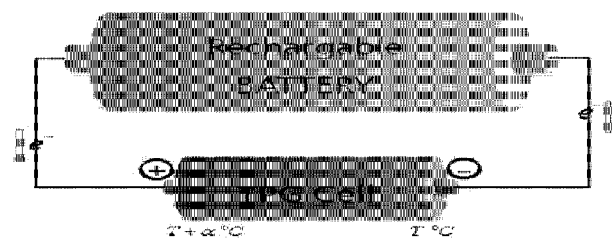
FIG. 14 shows charging of a secondary battery with a thermoelectric conversion device using a solvating material of the present invention.

According to another embodiment of the invention, a secondary battery can be charged by connecting to the both ends or the cathode and anode of the cell of the thermoelectric conversion device as shown in FIG. 14 FIG. 14 shows charging of a secondary battery with a thermoelectric conversion device using a solvating material of the present invention Hereinafter, although more detailed descriptions will be given by examples, those are only for explanation and there is no intention to limit the invention.

Example 1

A cell having a closed structure was prepared, in which a lithium ammonia compound as a solvating material which is composed with lithium 0.0369 g and ammonia 0.7571 g was embedded and of which a polarization having thickness 1.5 mm and volume 7313 $mm^3$ and composed of Teflon material, was located at the center and which has internal space. One side of the cell was composed of Al and the other was Fe. Al part of the cell was heated to 35° C. for 10 minutes. It was noted that voltage of 0.35V and current of 112 μA was generated.

Example 2

A cell having a closed structure was prepared, in which a lithium ammonia compound as a solvating material which is composed with lithium 0.019 g and ammonia 0.0645 g was embedded and of which a polarization having thickness 1.5 mm and volume 7313 mm$^3$ and composed of Teflon material, was located at the center and which has internal space. One side of the cell was composed of Al and the other was Fe. Al part of the cell was heated to 35° C. for 10 minutes. It was noted that voltage of 6.3V m and current of 3.5 μA was generated.

Example 3

Each cell of two independent thermoelectric conversion devices (plate type) of FIG. 2, in which a lithium ammonia compound as a solvating material which is composed with lithium 0.008 g and ammonia 0.0317 g was embedded and of which a porous separation membrane having thickness 1.5 mm and volume 7313 mm$^3$ and composed of polymer material having thickness of less than 1 mm was located at the center, was prepared. One side of each cell was jointed each other. One side of the cell was composed of Al and the other was Fe. Al part of the cell was heated to 35° C. for 10 minutes. It was noted that voltage of 7.9V m and current of 2.8 μA was generated.

While it has been described with reference to particular embodiments, it is to be appreciated that various changes and modifications may be made by those skilled in the art without departing from the spirit and scope of the embodiment herein, as defined by the appended claims and their equivalents.

10: heating unit
20, 21: cell body
30: polarization
31: porous separation membrane
40: cathode
41: anode
50: passageway space of polarization

What is claimed is:

1. A thermoelectric conversion device using a solvating material comprising:
    a cell with a closed structure, comprising a metal ammonia or metal amine compound as a solvating material;
    a polarization or porous separation membrane located at the center of the cell to separate the cell into two sides; and
    a heating unit located at one side of the cell.

2. The thermoelectric conversion device of claim 1, further comprising a cathode and an anode comprised of a metallic material each passing through the inside and outside the cell at the each end of the cell.

3. The thermoelectric conversion device of claim 2, wherein the metallic material of the cathode is one selected from the group consisting of Al, Fe, Pt, Ag, Au, and an alloy comprising at least one thereof.

4. The thermoelectric conversion device of claim 2, wherein the cathode is located at the one side being heated by the heating unit and the anode is located at the other side.

5. The thermoelectric conversion device of claim 1, wherein the structure of the cell is selected from the group consisting of a cylindrical type, a plate type, a tubular type, a circular type and a film type.

6. The thermoelectric conversion device of claim 1, wherein the two sides of the cell are comprised of a conductive material.

7. The thermoelectric conversion device of claim 6, wherein the material of one side of the cell has a lower thermal conductivity than that of the other side.

8. The thermoelectric conversion device of claim 1, wherein a metallic structure is embedded inside the cell to widen a contact area with the solvating material.

9. The thermoelectric conversion device of claim 1, wherein the polarization or porous separation membrane is comprised of an insulating material, the polarization has space which is a passageway penetrating the both ends of the cell, and the porous separation membrane is jointed with two individual cells having a closed structure therewith as the center.

10. The thermoelectric conversion device of claim 1, wherein the metal ammonia or metal amine compound includes an ammonia or amine compound and at least one metallic element selected from the group consisting of an alkali metal and an alkali earth metal.

11. The thermoelectric conversion device of claim 10, wherein the amine compound is at least one selected from the group consisting of methylamine, ethylamine, diglyme, ethanolamine, diethanolamine, n-propylamine, isoproplyamine, butylamine, triethylamine, hexamine, ethylenediamine, 1,3-propanediamine, 1,2-1 propanediamine, 1,4-butanediamine, 1,5-diaminopentane, hexanediamine, 1,7-diaminoheptane, 1,8-diaminooctane, and diethylenetriamine.

12. The thermoelectric conversion device of claim 1, wherein the metallic element is at least one selected from the group consisting of Li, Na, K, Rb, Cs, Mg, Ca, Sr, Ba, Ra, Cu, Al, Ga, In, Tl, Mn, Bi, V, Ti, Y(III), Zn, Fe, Cr, Ag, Pt, Hg, Pb, Be, La, Ce, Cd, and Eu.

13. The thermoelectric conversion device of claim 1, wherein a heating source of the heating unit is waste heat.

14. A method for charging a secondary battery by connecting the both ends or the cathode and anode of the cell of the thermoelectric conversion device according to claim 1 with the both electrodes of the secondary battery.

* * * * *